US007645713B2

(12) United States Patent
Hayashida et al.

(10) Patent No.: US 7,645,713 B2
(45) Date of Patent: Jan. 12, 2010

(54) SUBSTRATE PROCESSING SYSTEM AND SUBSTRATE PROCESSING METHOD

(75) Inventors: Yasushi Hayashida, Koshi (JP); Shinichi Hayashi, Koshi (JP); Yoshitaka Hara, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 427 days.

(21) Appl. No.: 11/436,810

(22) Filed: May 19, 2006

(65) Prior Publication Data
US 2006/0276046 A1 Dec. 7, 2006

(30) Foreign Application Priority Data
Jun. 7, 2005 (JP) ............................. 2005-166939

(51) Int. Cl.
*H01L 21/00* (2006.01)
(52) U.S. Cl. .................. 438/800; 438/780; 355/27; 355/29; 396/611; 257/E21.001; 257/E21.487
(58) Field of Classification Search ................. 438/780, 438/800; 355/27, 29; 396/611
See application file for complete search history.

(56) References Cited
U.S. PATENT DOCUMENTS
6,795,745 B1 9/2004 Ueno et al.
6,893,171 B2 * 5/2005 Fukutomi et al. ........... 396/611

6,902,762 B2 6/2005 Miyata

FOREIGN PATENT DOCUMENTS
JP 2004-193597 7/2004

* cited by examiner

*Primary Examiner*—Alexander G Ghyka
(74) *Attorney, Agent, or Firm*—Oblon, Spivak, McClelland, Maier & Neustadt, L.L.P.

(57) ABSTRACT

A substrate processing system processes a plurality of substrates in a single-substrate processing mode by a plurality of processes and provided with a plurality of modules respectively for carrying out processes. When a defect is found in a substrate, a defective processing unit that caused the defect can be easily found out. The substrate processing system and a substrate processing method to be carried out by the substrate processing system can suppress the reduction of throughput when a large number of substrates are to be processed. The substrate processing system is provided with a plurality of modules for processing a plurality of substrates (W) in a single-substrate processing mode by a plurality of processes and includes a substrate carrying means (A4) for carrying a substrate (W) from a sending module to a receiving module, and a control means (6) for controlling the substrate carrying means (A4) on the basis of one of at least two carrying modes each assigning receiving modules to sending modules. The control means (6) changes the carrying mode in effect for the other carrying mode upon the reception of a carrying mode change command while substrates are being processed and makes the substrate carrying means (A4) carry substrates in the carrying mode newly brought into effect.

5 Claims, 9 Drawing Sheets

| | | | | | |
|---|---|---|---|---|---|
| | COL5 | CHP5 | CHP5 | CHP5 | CHP5 |
| B5 BCT LAYER | COL5 | COL5 | COL5 | CHP5 | CHP5 |
| | COL4 | CHP4 | CHP4 | CHP4 | WEE |
| B4 COT LAYER | COL4 | CHP4 | COL4 | CHP4 | CHP4 |
| | COL3 | CHP3 | CHP3 | CHP3 | WEE |
| B3 TCT LAYER | COL3 | CHP3 | COL3 | CHP3 | CHP3 |
| | POST2 | POST2 | PEB2 | PEB2 | PEB2 |
| B2 DEV LAYER | POST2 | POST2 | PEB2 | COL2 | COL2 |
| | POST1 | POST1 | PEB1 | PEB1 | PEB1 |
| B1 DEV LAYER | POST1 | POST1 | PEB1 | COL1 | COL1 |

FIG. 5

...NUMERALS WITH A MARK # INDICATE THE NUMBERS OF WAFERS

SUBSTRATE PROCESSING SYSTEM AND SUBSTRATE PROCESSING METHOD

BACKGROUND OF THE INVENTION

1. Field of the Invention

The present invention relates to a substrate processing system and a substrate processing method for processing substrates, such as semiconductor wafers or LCD substrates, namely, glass substrates for LCDs, by a resist film forming process and a developing process which is carried out after an exposure process.

2. Description of the Related Art

A manufacturing process for manufacturing semiconductor devices or LCD substrates forms a circuit pattern by a photolithographic technique that forms a predetermined film on a substrate, namely, a workpiece, coats the predetermined film with a resist film by applying a liquid photoresist (hereinafter, referred to as "resist") to the predetermined film, exposes the resist film to light in a predetermined circuit pattern and processes the exposed resist film by a developing process. This photolithographic technique forms a resist pattern corresponding to a predetermined circuit pattern by subjecting a substrate sequentially to a series of processes including a cleaning process, a dehydrating process, a baking process, an adhesion process (hydrophobicity imparting process), a resist film forming process, a prebaking process, an exposure process, a predevelopment baking process, a developing process and a postbaking process.

The series of processes is carried out by a resist pattern forming system built by connecting a resist film forming and developing system and an exposure system. A resist pattern forming system as shown in FIG. 10 is proposed in, for example, Patent document 1. To process wafers W by the resist pattern forming system shown in FIG. 10, a carrier 10 holding a plurality of wafers W is delivered to a carrier stage 11 included in a carrier block 1A, and then a transfer arm 12 takes our a wafer W from the carrier 10 and carries the wafer W to a processing block 1B. The wafer W is carried to a coating unit 13A included in the processing block 1B. The coating unit 13A forms a resist film on the wafer W. Then, the wafer W is carried through an interface block 1C to an exposure system 1D.

The wafer W processed by an exposure process is returned to the processing block 1B and is subjected to a developing process by a developing unit 13B. Then the wafer W is returned into the carrier 10. In FIG. 10, shelf units 14 (14a to 14c) are provided with a heating unit and a cooling unit for processing a wafer W by a heating process and a cooling process, respectively, before and after processes executed by the coating unit 13A and the developing unit 13B, and a transfer stage. A wafer W is carried by two carrying devices 15A and 15B placed in the processing block 1B to and from modules, on which the wafer is placed, in the coating unit 13A, the developing unit 13B and the shelf units 11a to 14c of the processing block 1B.

When a wafer W is processed by the foregoing processes, the wafer W is carried according to a carrying schedule that times operations for carrying the wafer to the processing units. The carrying schedule is designed to carry a wafer W sequentially to processing units for processing the wafer W before exposure by, for example, two carrying devices 15A and 15B, to deliver the wafer W to the interface block 1C, to receive the wafer W processed by the exposure process from the interface block 1C and to carry the wafer W sequentially to the processing units for carrying out processes to be carried out after the exposure process. Thus the carrying devices 15A and 15B move round the processing block 1B in one carrying cycle. Thus an unprocessed wafer W sent out from the carrier 10 is carried into the processing block 1B every one carrying cycle.

Patent document 1: JP-A 2004-193597

The carrying schedule specifies the order of the processing units in which each of the plurality of wafers W to be processed is carried sequentially to the processing units. If each processing unit or the plurality of processing units are provided with a plurality of modules of the same construction and capable of carrying out the same process, usually, it is not determined to carry a wafer W from which module to which module. For example, when a wafer W is to be carried from the coating unit 13A to the shelf units 14a to 14c, the sequence of carrying the wafer W to the plurality of modules for the film forming process and the heating process is not determined, because a wafer processed by a coating module is carried in a flexible carrying mode to the thermal modules. The flexible carrying mode carries the wafer sequentially to the plurality of inoperative thermal modules to operate the system at a high throughput.

When the wafer W is carried sequentially to the inoperative thermal modules by this flexible carrying mode, it is difficult to find out the coating module processed the wafer by the coating process when a defect, such as a defective film of an abnormal thickness, attributable to the coating process is found in the wafer W. Thus the known system has a technical problem in finding out a defective module. In some cases, the carrying arm needs to move long distances when wafers are carried in this flexible carrying mode and the carrying operation is inefficient when a large number of wafers are processed and throughput will drop.

SUMMARY OF THE INVENTION

The present invention has been made under the foregoing circumstances and it is therefore an object of the present invention to provide a substrate processing system capable of processing a plurality of substrates by a plurality of successive processes in a single-substrate processing mode, having a plurality of processing modules and capable of finding a defective processing unit that caused a defect in a substrate and of suppressing the reduction of throughput when a large number of substrates are processed, and to provide a substrate processing method to be carried out by the substrate processing system.

The present invention provides, to solve the foregoing problems, a substrate processing system, capable of processing a plurality of substrates in a single-substrate processing mode by a plurality of processes and provided with a plurality of modules respectively for carrying out the processes, including: a substrate carrying means for carrying a substrate from sending modules to receiving modules; and a control means for controlling the substrate carrying means on the basis of one of at least two carrying modes each assigning receiving modules to sending module; wherein the control means changes the carrying mode in effect for the other carrying mode upon the reception of a carrying mode change command while the substrate is being processed and makes the substrate carrying means carry the substrate in the carrying mode newly brought into effect.

Desirably, at least one of the carrying modes is a permanent assignment mode that permanently assigns one or a plurality of receiving modules to one or a plurality of sending modules under predetermined conditions and it is preferable that one of the predetermined conditions is assigning receiving modules at shorter carrying distances from sending modules to the sending modules.

Preferably, one of the carrying modes preferentially selects an inoperative module as a receiving module.

The present invention provides a substrate processing method, to be carried out by a substrate processing system capable of processing a plurality of substrates in a single-substrate processing mode by a plurality of processes and provided with a plurality of modules respectively for carrying out successive processes, including the steps of: carrying the substrate in one of at least two carrying modes each specifying a method of assigning receiving modules to sending modules; and changing the carrying mode in effect for the other carrying mode when a carrying mode change command is given while substrates are being processed and carrying substrates in the carrying mode newly brought into effect.

Preferably, at least one of the carrying modes is a permanent assignment mode that permanently assigns one or a plurality of receiving modules to one or a plurality of sending modules under predetermined conditions and it is preferable that one of the predetermined conditions is selecting receiving modules at shorter carrying distances from sending modules.

Preferably, one of the carrying modes preferentially selects an inoperative module as a receiving module.

If one of the sending modules malfunctions when a flexible carrying mode that preferentially selects an inoperative module as a receiving module is selected as a basic carrying mode and a carrying operation is performed in the flexible carrying mode, the defective module can be easily found by changing the flexible carrying mode for the permanent assignment mode that determines permanent correspondence between the sending and the receiving module. The carrying mode is changed for the flexible carrying mode after making the defective module inoperative to continue processing the plurality of substrates.

When the carrying operation is performed in the flexible carrying mode as the basic carrying mode to process a large number of substrates, the substrates can be carried through shorter carrying routes by changing the flexible carrying mode for a permanent assignment mode that determines permanently correspondence between the sending and the receiving modules and thereby the reduction of throughput can be suppressed.

According to the present invention, a plurality of substrates are processed by the plurality of processes in a single-substrate processing mode. If a defect is found in a substrate while substrates are being processed by successive processes by the substrate processing system provided with the modules for carrying out the processes, the processing unit that caused the defect can be easily found. Thus the substrate processing system and the substrate processing method of the present invention can suppress the reduction of throughput when the substrate processing system processes a large number of substrates by the substrate processing method.

BRIEF DESCRIPTION OF THE DRAWINGS

FIG. 5 is a typical diagram of modules included in a shelf unit;

DESCRIPTION OF THE PREFERRED EMBODIMENTS

Figure 1:
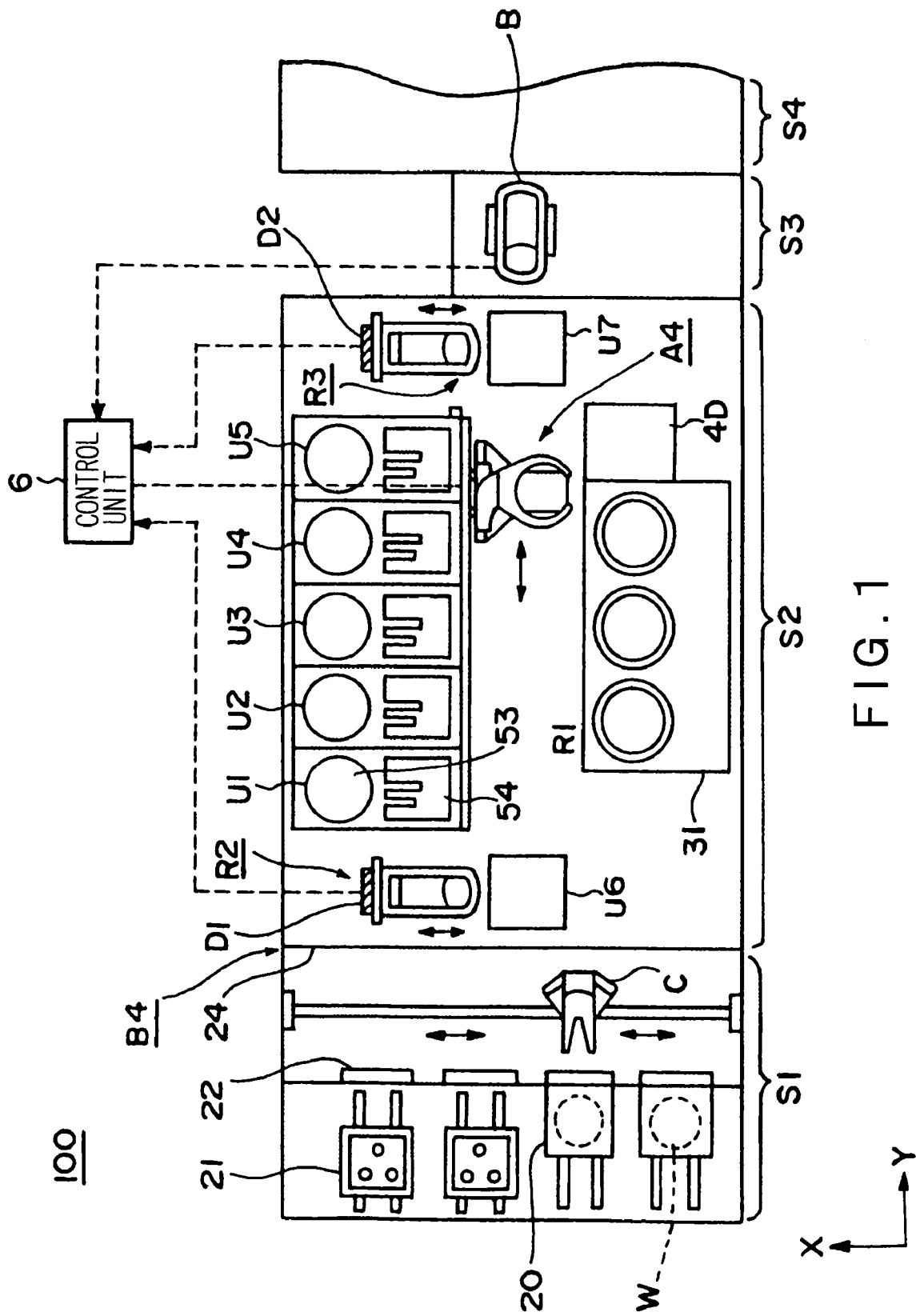
FIG. 1 is a plan view of a resist pattern forming system to which a substrate processing system and a substrate processing method of the present invention are applied.
Figure 2:
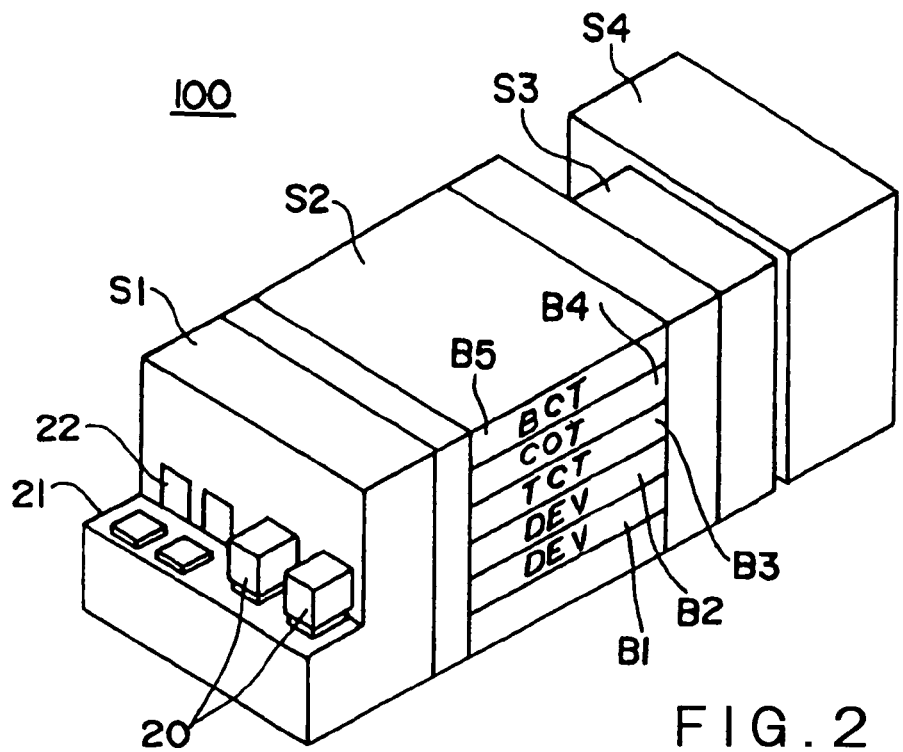
FIG. 2 is a schematic perspective view of the resist pattern forming system to which a substrate processing system and a substrate processing method of the present invention are applied.
Figure 3:
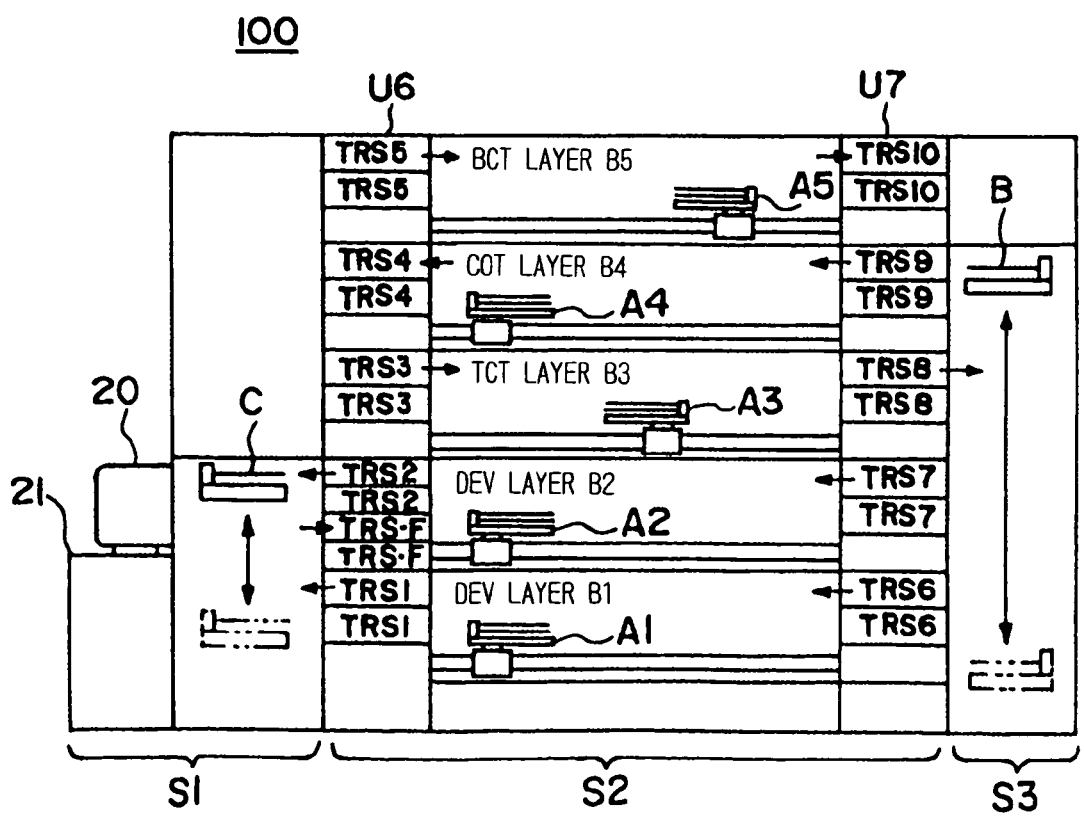
FIG. 3 is a schematic side elevation of the resist pattern forming system to which a substrate processing system and a substrate processing method of the present invention are applied.

Preferred embodiments of the present invention will be described with reference to the accompanying drawings. FIGS. 1 to 3 show a resist pattern forming system 100 to which a substrate processing system and a substrate processing method of the present invention are applied. FIG. 1 is a plan view of a COT layer processing unit, FIG. 2 is a schematic perspective view and FIG. 3 is a schematic side elevation.

Referring to FIG. 2, the resist pattern forming system 100 includes a carrier block S1 to which a hermetic carrier 20 holding a plurality of wafers W, namely, substrates, is delivered and from which the carrier 20 is sent out, a processing block S2 formed by vertically stacking up, for example, five unit blocks B1 to B5, an interface block S3 and an exposure system S4.

The carrier block S1 has a support table 21 capable of supporting a plurality of carriers 20 thereon, doors 22 formed in a wall behind the support table 21, and a transfer arm C, namely, a carrying means for taking out a wafer W through the door 22 from the carrier 20. The transfer arm C carries a wafer W to and from transfer stages TRS1, TRS2 and TRS-F included in the processing block S2. The transfer arm C can move in forward and backward directions, vertical directions and lateral directions parallel to the row of the carriers 20 and can turn about a vertical axis.

The processing block S2 surrounded by a box 24 is connected to the back end of the carrier block S1. As shown in FIGS. 2 and 3, in the processing block S2 in this embodiment has two bottom layers assigned to a first unit block B1 and a second unit block B2 (DEV layers) for carrying out a developing process, a third unit block (TCT layer) B3 for carrying gout an antireflection film forming process for forming an antireflection film on a resist film, a fourth unit block (COT layer) B4 for carrying out a coating process to coat a surface of a wafer W with a liquid resist, and a fifth unit block (BCT layer) B5 for carrying out an antireflection film forming process for forming an antireflection film under a resist film.

The construction of the first unit block B1 to the fifth unit block B5 of the processing block S2 will be described. The unit blocks B1 to B5 are provided with coating units for applying a chemical solution to wafers W, heating/cooling units for processing wafers W by a pretreatment before processing wafers W by the coating units and for processing the wafers W by a posttreatment after the wafers W have been processed by the coating units, and main arms A1 to A5, namely, substrate carrying means, for carrying wafers W between the coating units and the heating/cooling units.

The COT layer B4 shown in FIG. 1 will be described by way of example because the respective layouts of the unit blocks B1 to B5 of this embodiment are substantially the same. A carrying zone R1 in which a wafer W is carried extends in a direction parallel to the Y-axis in a substantially central part of the COT layer B4 between the carrier block S1 and the interface block S3.

A coating unit 31 is disposed in a right-hand part, as viewed from the carrier block S1. The coating unit 31 is provided with a plurality of coating modules, (for example, three coating modules) for carrying out a coating process for applying a resist to a wafer. The coating modules are arranged in a line from the side of the carrier block S1 toward the interface block S3. A storage unit 4D is disposed behind the coating unit 31. The storage unit 4D is provided with a plurality of support stages for supporting wafers W thereon. The number of the support stages corresponds to the number of wafers W that can be held in the unit block B4.

Five shelf units U1 to U5 are arranged in a line from the front side of the COT layer B4 backward in a left-hand part of the COT layer B4. The shelf units U1 to U5 have heating/cooling units stacked up in layers. The shelf units U1 to U5 have units for processing wafers W by a pretreatment before processing the wafers W by the coating unit 31 and for processing wafers W by a posttreatment after the wafers W have been processed by the coating unit 31. The units of the shelf units U1 to U5 are stacked up in a plurality of layers, such as two layers. The carrying zone R1 is thus demarcated. Clean air, for example, is circulated through the carrying zone R1 to reduce particles floating in the carrying zone R1.

Figure 4:
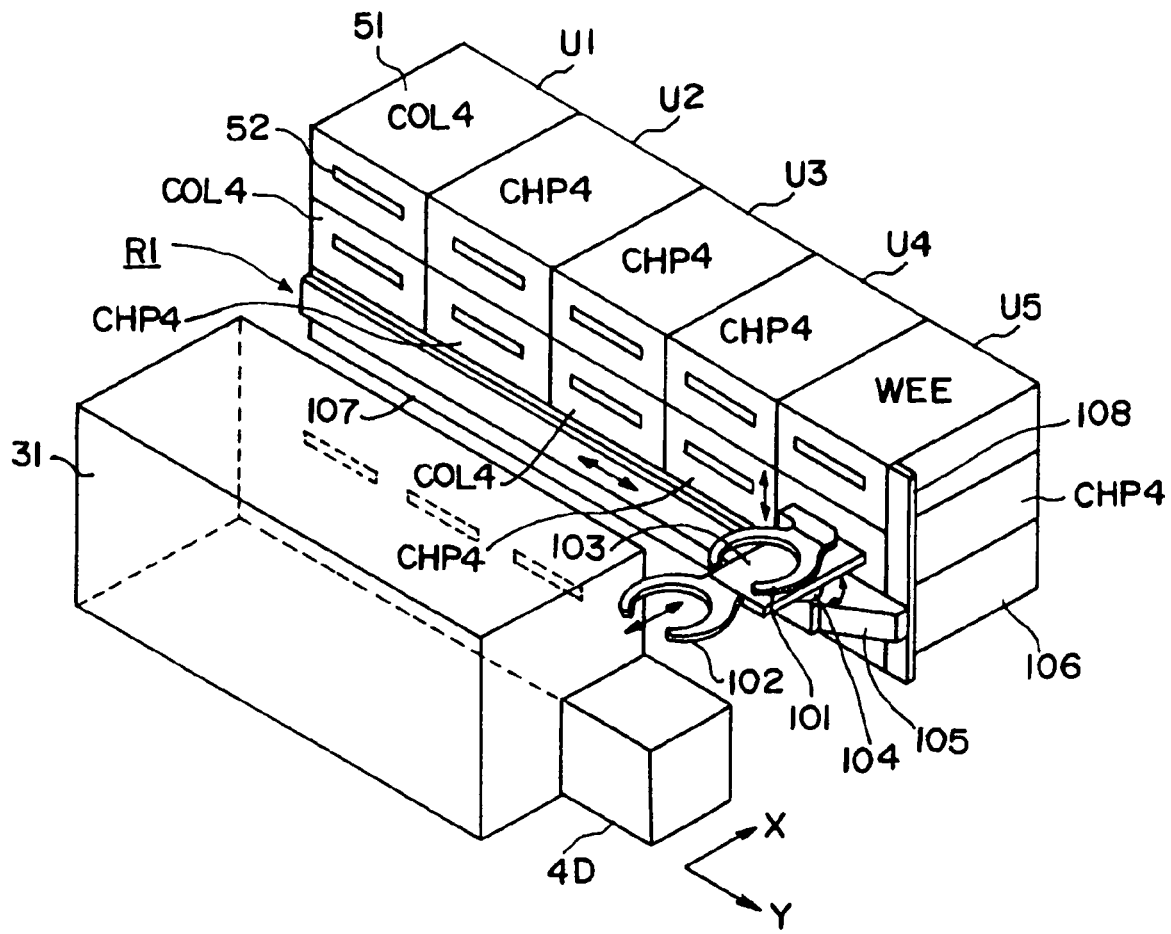
FIG. 4 is a perspective view showing the construction of shelf units of a COT layer included in the resist pattern forming system shown in FIGS. 1 to 3.

As shown in a perspective view in FIG. 4, the units for carrying out the pretreatment and the post treatment include cooling units COL4 for adjusting the temperature of a wafer W to a predetermined temperature before a resist is applied to the wafer W, heating units CHP4, called as prebaking units, for heating a wafer W after a resist has been applied thereto and peripheral exposure units WEE for selectively exposing only a peripheral part of a wafer W to light.

Each of the modules of the cooling units COL4 and the heating units CHP4 is contained in a processing vessel 51. The processing vessels 51 of the shelf units U1 to U5 are stacked in two layers. A side, facing the carrying zone R1, of each processing vessel 51 is provided with a doorway 52 through which a wafer W is carried into and is carried out of the processing vessel 51.

Modules of the shelf units the layers other than the COT layer B4 are arranged as shown in FIG. 5. FIG. 5 is a view of the shelf units U1 to U5 taken from the side of the carrying zone R1. As shown in FIG. 5, the TCT layer B3 and the BCT layer B5 are similar in construction to the COT layer B4. The DEV layers B1 and B2 have heating units PEB B1 and PEB B2 called postexposure baking units for heating a wafer W after exposure, cooling units COL1 and COL2 for adjusting the temperature of wafers W processed by the heating units PEB1 and PEB2 to a predetermined temperature and heating units POST1 and POST2, called postbaking units, for heating wafers W processed by a developing process to remove moisture from the wafers W.

As shown in FIG. 1, each of the heating units CHP3 to CHP5 and POST1, POST2, PEB1 and PEB2 is provided with a heating plate 53 and a cooling plate 54 which also serves as a carrying arm. The one module can execute both a heating process and a cooling process. In the COT layer b4, the cooling plate 54 transfers a wafer W between the main arm A4 and the heating plate 53. The cooling units COL1 to COL5 are provided with, for example, a water-cooled cooling plate.

The layout of the processing units shown in FIG. 5 is only an example and is shown for convenience. The processing units are not limited to the heating units CHP, PEB and POST, cooling units COL and the peripheral exposure units WEE. For example, one of the film forming unit blocks B1 to B5 may be provided with a hydrophobicity imparting unit ADH or some other unit. The hydrophobicity imparting unit ADH processes a wafer W in an atmosphere of HMDS to improve the adhesion of a liquid resist to the wafer W. The number of the units is determined taking into consideration processing times needed respectively by the processing units.

The main arm A4 is installed in the carrying zone R1 of the COT layer B4. The main arm A4 carries a wafer from and to all the modules (places where a wafer W is placed) of the COT layer B4, such as the processing units of the shelf units U1 to U5, the coating unit 31, the storage unit 4D and the components of shelf units U6 and U7. The main arm A4 can move forward and backward directions, vertical directions and longitudinal directions parallel to the Y-axis and can turn about a vertical axis.

As shown in FIG. 4, the main arm A4 is provided with two arms 101 and 102 on which a peripheral part of a wafer W can be seated. The arms 101 and 102 can individually move forward and backward along a base 103.

The base 103 can be turned about a vertical axis by a turning mechanism 104. The base 103 can be moved in directions parallel to the Y-axis along a Y-axis rail 107 attached to a surface, facing the carrying zone R1, of a bed 106 supporting the shelf units U1 to U5 thereon. The base 103 can be moved vertically along a vertical rail 108. The arms 101 and 102 can move in forward and backward directions, vertical directions and longitudinal directions parallel to the Y-axis and can turn about a vertical axis. Thus the arms 101 and 102 can carry wafers from and to the transfer stages TRS1 to TRS10 of the shelf units U1 to U7, the coating units and the storage unit 4D.

A part of the carrying zone R1 adjacent to the carrier block S1 serves as a first wafer transfer zone R2. As shown in FIGS. 1 and 3, a shelf unit U6 is disposed in the first wafer transfer zone R2 such that the transfer arm C and the main arm A4 can access the shelf unit U6. As shown in FIG. 1, a first transfer arm D1 is disposed in the transfer zone R2 to deliver a wafer W to and to receive a wafer W from the shelf unit U6.

As shown in FIG. 3, the shelf unit U6 is provided with, for example, two first transfer stages TRS1, two first transfer stages TRS2, two first transfer stages TRS3, two first transfer stages TRS4 and two first transfer stages TRS5 corresponding to the unit blocks B1 to B5, respectively. The respective main arms A1 to A5 of the unit blocks B1 to B5 carry a wafer W to and receives a wafer W from the first transfer stages TRS1 to TRS5, respectively. The first transfer arm D1 can move forward, backward and vertically to deliver a wafer W to and to receive a wafer W from the first transfer stages TRS1 to TRS5.

The first transfer stages TRS1 of the first unit block B1 and the first transfer stages TRS2 of the second unit block B2 receive a wafer W from and transfer a wafer W to the transfer arm C. The second unit block B2 is provided with, for example, two first transfer stages TRS-F. The first transfer stages TRS-F may be included in the first unit block B1. The transfer arm C may use the first transfer stages TRS1 and TRS2 instead of the transfer stages TRS-F to carry a wafer W into the processing block S2.

A part of the carrying zone R1 adjacent to the interface block S3 serves as a third wafer transfer zone R3. As shown in FIGS. 1 and 3, a shelf unit U7 is disposed in the third wafer transfer zone R3. The main arm A4 can access the shelf unit U7. As shown in FIG. 1, a second transfer arm D2 is disposed in the third wafer transfer zone R3 to deliver a wafer W to and to receive a wafer W from the shelf unit U7.

As shown in FIG. 3, the shelf unit U7 is provided with, for example, two second transfer stages TRS6, two second transfer stages TRS7, two second transfer stages TRS8, two second transfer stages TRS9 and two second transfer stages TRS10 corresponding to the unit blocks B1 to B5, respectively. The respective main arms A1 to A5 of the unit blocks B1 to B5 carry a wafer W to and receives a wafer W from the second transfer stages TRS6 to TRS10, respectively. The second transfer arm D2 can move forward, backward and vertically to deliver a wafer W to and to receive a wafer W from the second transfer stages TRS6 to TRS10.

In the resist pattern forming system 100 in this embodiment, wafers W can be optionally carried to and received from the unit blocks B1 to B5 stacked up in five layers through the first transfer stages TRS1 to TRS5 and TRS-F and the second transfer stages TRS6 to TRS10 by the first transfer arm D1 and the second transfer arm D2.

Referring to FIGS. 1 and 2, the exposure system S4 is connected to the shelf unit U7 of the processing block S2 by the interface unit 53. The interface block S3 is provided with an interface arm B for carrying a wafer W between the shelf unit U7 of the processing block s2 and the exposure system S4. The interface arm B is a carrying means disposed between the processing block S2 and the exposure system S4. The interface arm B can move forward, backward and vertically and can turn about a vertical axis to deliver a wafer W to and to receive a wafer W from the second transfer stages TRS6 to TRS9 of the unit blocks B1 to B4. The interface arm B may be designed so as to deliver a wafer W to and receive a wafer W from the second transfer stages TRS6 to TRS10 of all the unit blocks B1 to B5.

The flow of a wafer W to be processed in a single-wafer processing mode by the resist pattern forming system 100 will be described on an assumption that antireflection films are formed over and under a resist film, respectively.

A carrier 20 is delivered to the carrier block S1. The transfer arm C takes out a wafer W from the carrier 20 and transfers the wafer W to the first transfer stage TRS-F of the shelf unit U6. Subsequently, the wafer W is transferred through the first transfer stage TRS5 of the shelf unit U6 to the main arm At of the BCT layer B5 to transfer the wafer W to the BCT layer B5 by the first transfer arm D1. The main arm A5 of the BCT layer B5 carries the wafer W sequentially to the cooling unit COL5, the first antireflection film forming unit, not shown, the heating unit CHP5 and the second transfer stage TRS10 of the shelf unit U7. Thus a first antireflection film is formed.

Then, the second transfer arm D2 carries the wafer W from the second transfer stage TRS10 to the second transfer stage TRS9 of shelf unit U7 to transfer the wafer W to the COT layer B4. Then, the wafer W is transferred to the main arm A4 of the COT layer B4. In the COT layer B4, the main arm A4 carries the wafer W sequentially to the cooling unit COL4, the coating unit 31, the heating unit CHP4 and the first transfer stage TRS4 of the shelf unit U6. Thus a resist film is formed on the first antireflection film.

Then the first transfer arm D1 carries the wafer W from the first transfer stage TRS4 to the first transfer stage TRS3 to transfer the wafer W to the TCT layer B3. In the TCT layer B3, the main arm A3 carries the wafer W sequentially to the cooling unit COL3, the second antireflection film forming unit, not shown, the heating unit CHP3, the peripheral exposure unit WEE and the second transfer stage TRS8 of the shelf unit U7. Thus a second antireflection film is formed on the resist film. Subsequently, the interface arm B carries the wafer W from the second transfer stage TRS8 to the exposure system S4 to subject the wafer W to a predetermined exposure process.

The interface arm B carries the wafer W processed by the exposure process to the second transfer stage TRS6 (TRS7) of the shelf unit U7 to transfer the wafer W to the DEV layer B1 (DEV layer B2). The main arm A1 (main arm A2) of the DEV layer B1 (DEV layer B2) picks up the wafer W from the second transfer stage TRS6 (TRS7). In the DEV layer B1 (DEV layer B2), the main arm A1 (main arm A2) carries the wafer W sequentially to the heating unit PEB1 (PEB2), the cooling unit COL1 (COL2), the developing unit, not shown, and the heating unit POST (POST2) to process the wafer W by a predetermined developing process. Then, the wafer W processed by the developing process is transferred to the first transfer stage TRS1 (TRS2) of the shelf unit U6 to transfer the wafer W to the transfer arm C. Then, the transfer arm C returns the wafer W into the carrier 20 placed in the carrier block S1.

A carrying operation control procedure to be carried out by the resist pattern forming system 100 will be described. As shown in FIG. 1, operations of the carrying arms (substrate carrying means) of the resist pattern forming system 100, namely, the first transfer arm D1, the second transfer arm D2, the main arm A4, the transfer arm C, the interface arm B, are controlled by a control unit 6 (control means) including a computer.

Figure 6:
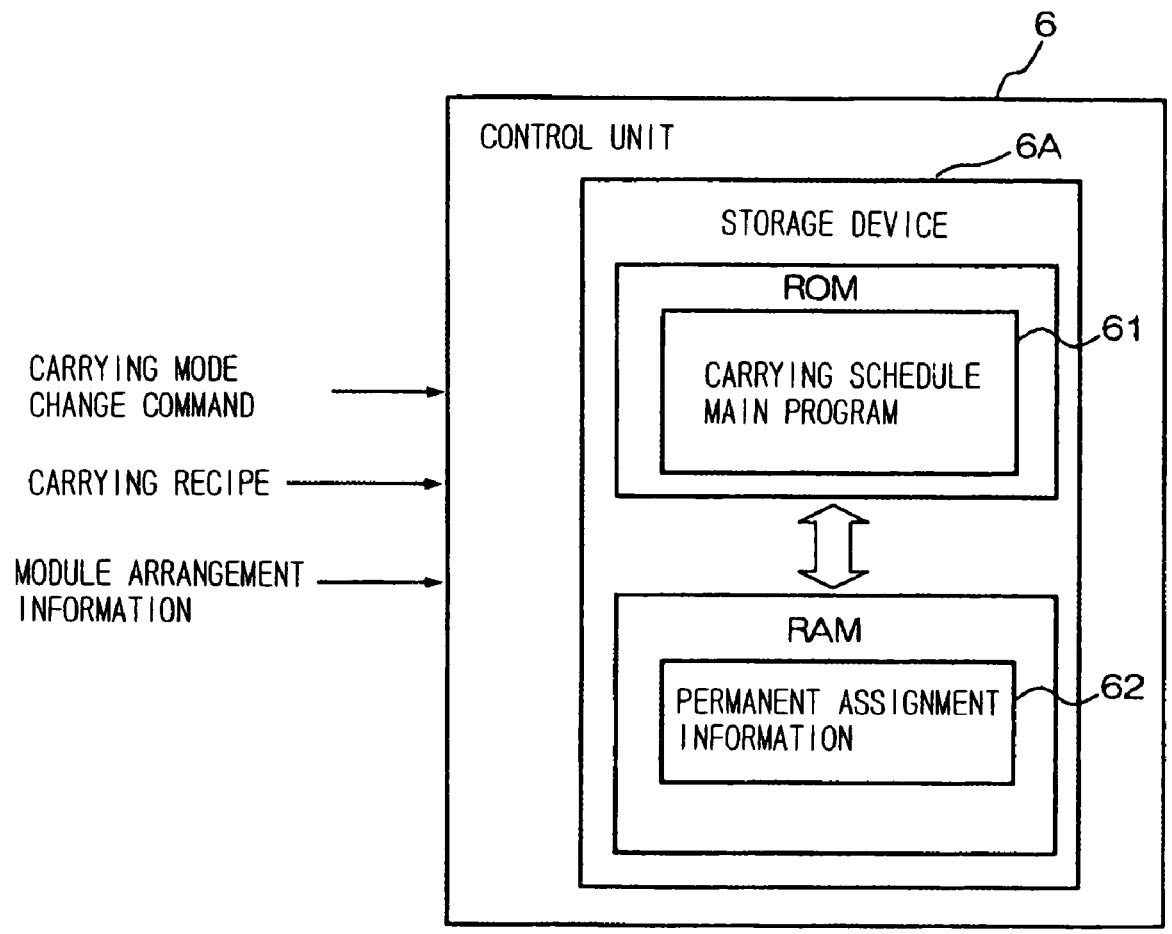
FIG. 6 is a block diagram of a storage device included in a control unit.

As shown in a block diagram in FIG. 6, the control unit 6 has a storage device 6A storing a carrying schedule main program 61 and permanent assignment information 62. The carrying arms of the resist film forming system 100 are controlled according to the carrying schedule main program 61 to carry a wafer. A carrying operation to carry a wafer to the processing units to process the wafer in predetermined order of processes is determined by a carrying recipe entered by an external device into the control unit 6.

The carrying schedule main program 61 employs a flexible carrying mode as a basic carrying mode for selecting the sending modules and the receiving modules. When a wafer W is carried in the flexible carrying mode, the wafer W processed by the sending module is carried preferentially to an inoperative receiving module when the wafer W is to be processed by successive processes by the modules. When the wafer W is carried in the flexible carrying mode, waiting time for which carrying the wafer W is suspended can be reduced and hence the improvement of throughput can be expected when the number of wafers W to be processed is not very large.

The permanent assignment information 62 is made on the basis of the carrying recipe information provided by the external device and information about the arrangement of the modules. The permanent assignment information 62 assigns the receiving modules permanently to the sending modules under predetermined conditions.

When a wafer W is carried from one of the three coating modules to one of the six heating modules, the permanent assignment information 62 assigns permanently, for example, the two heating modules to each coating module such that carrying distance is shorter. A wafer W is carried from each coating module to either of the two heating modules assigned to the coating module.

Although the two heating modules are assigned to the one coating module in this embodiment, the ratio between the number of sending modules and that of the receiving modules assigned to the sending modules is determined according to the respective numbers of the sending modules and the receiving modules.

The permanent assignment information 62 is used when the carrying schedule specifies a permanent assignment mode. The permanent assignment mode is a carrying mode in which one or a plurality of receiving modules are assigned permanently to a plurality of sending modules under predetermined conditions for each wafer W.

To execute the permanent assignment mode, a flexible carrying mode is replaced with the permanent assignment mode, for example, when the permanent assignment information 62 is linked to the carrying schedule main program 61 by giving a carrying mode change command to the control unit 6 by an external device.

Figure 7:
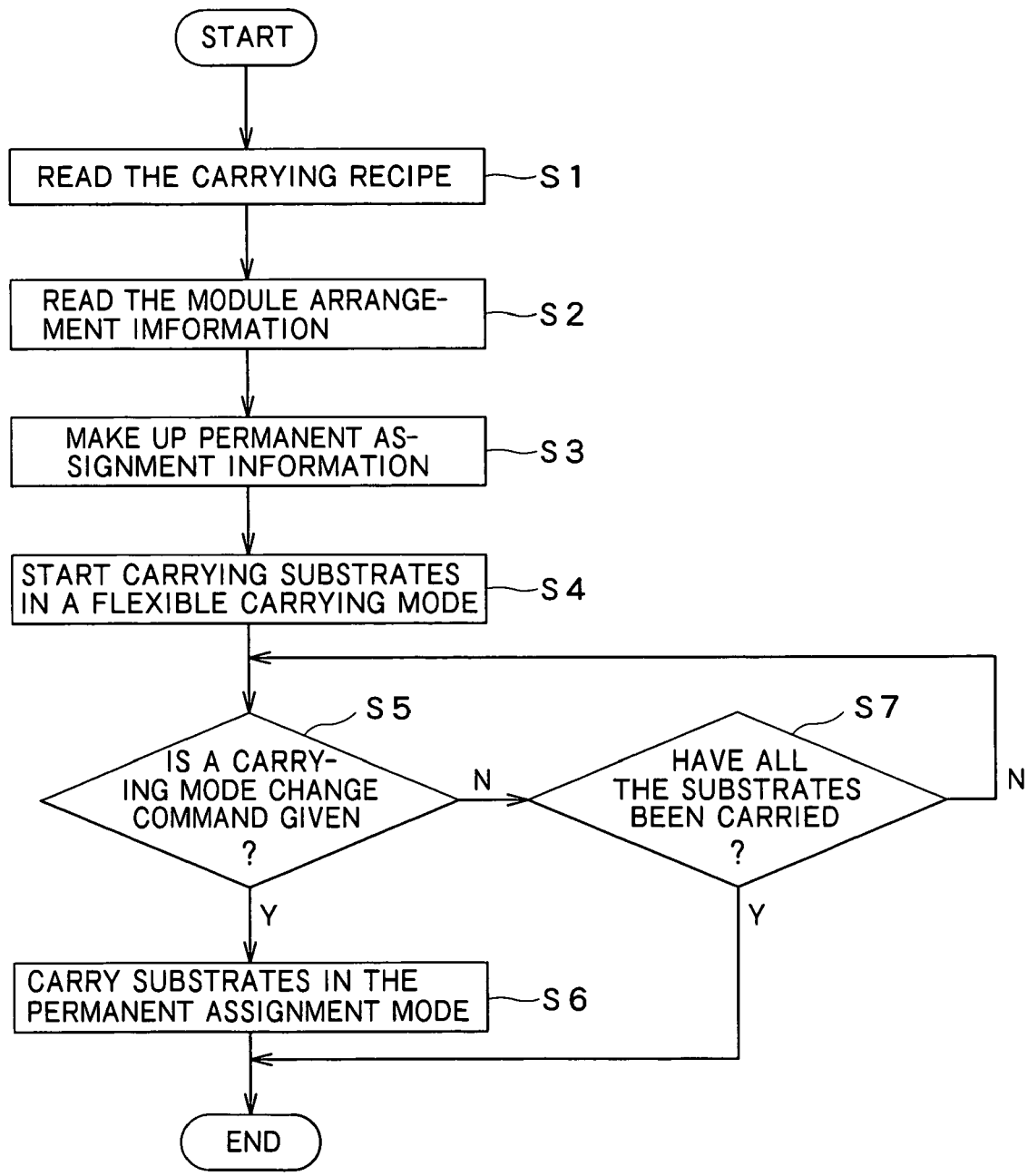
FIG. 7 is a flow chart of a carrying mode selecting procedure.

The assignment of the receiving modules to the sending modules will be more specifically described. In the COT layer B4, the coating unit 31 has the three coating modules, and the shelf units U1 to U5 has the six heating unit (heating modules) CHP4. The main arm A4 carries a wafer W processed by a coating process by one of the three modules of the coating unit 31 to the module of one of the heating modules CHP4. The assignment of the receiving module to the sending module will be described with reference to FIGS. 7 to 9. FIG. 7 is a flow chart of a carrying mode selecting procedure, FIG. 8 is a diagram showing the correspondence of sending modules and receiving modules for a flexible carrying mode and FIG. 9 is a diagram showing the correspondence of sending modules and receiving modules for a permanent assignment mode.

Figure 8:
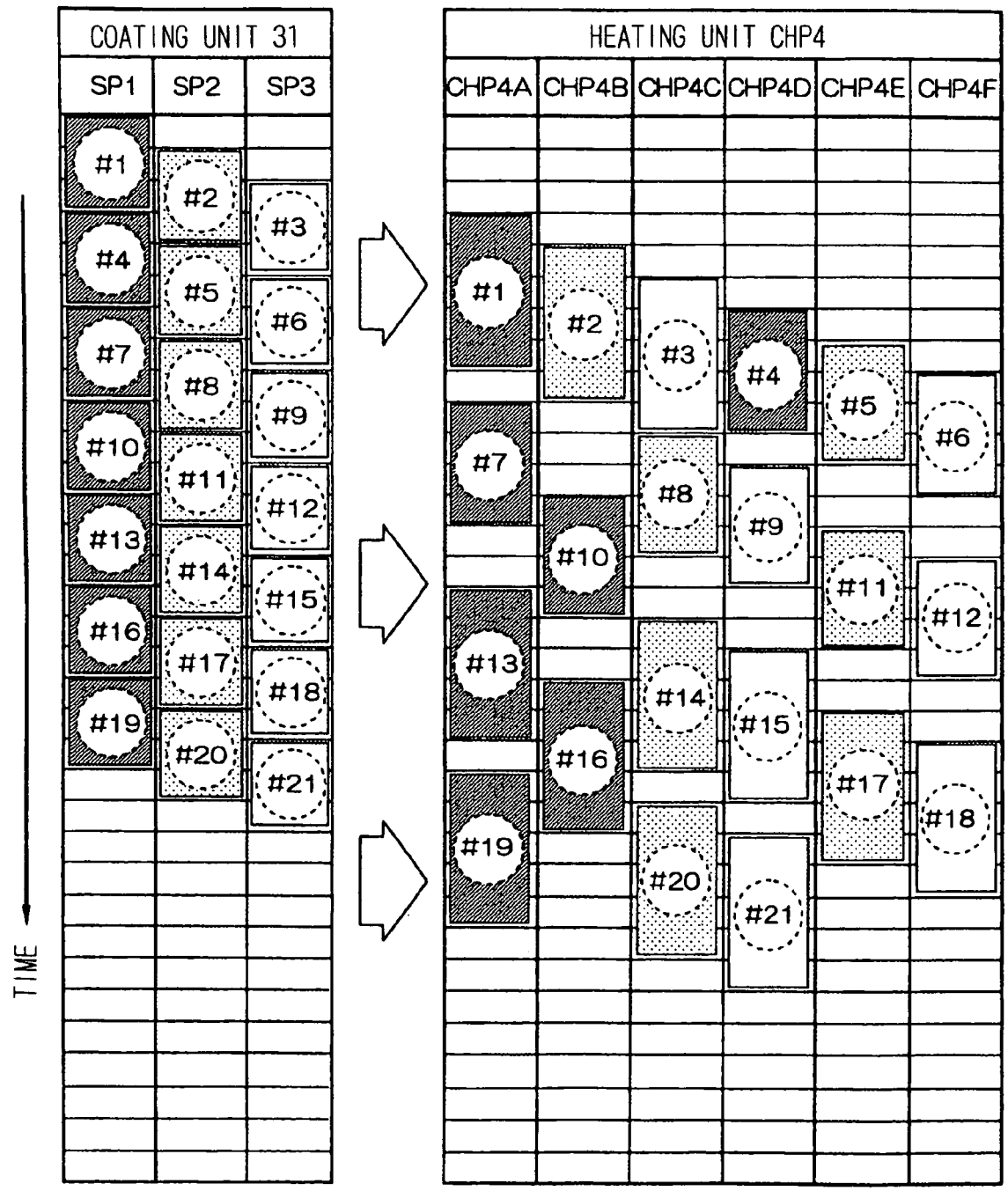
FIG. 8 is a diagram showing the correspondence of sending modules and receiving modules for a flexible carrying mode.
Figure 8:
Figure 9:
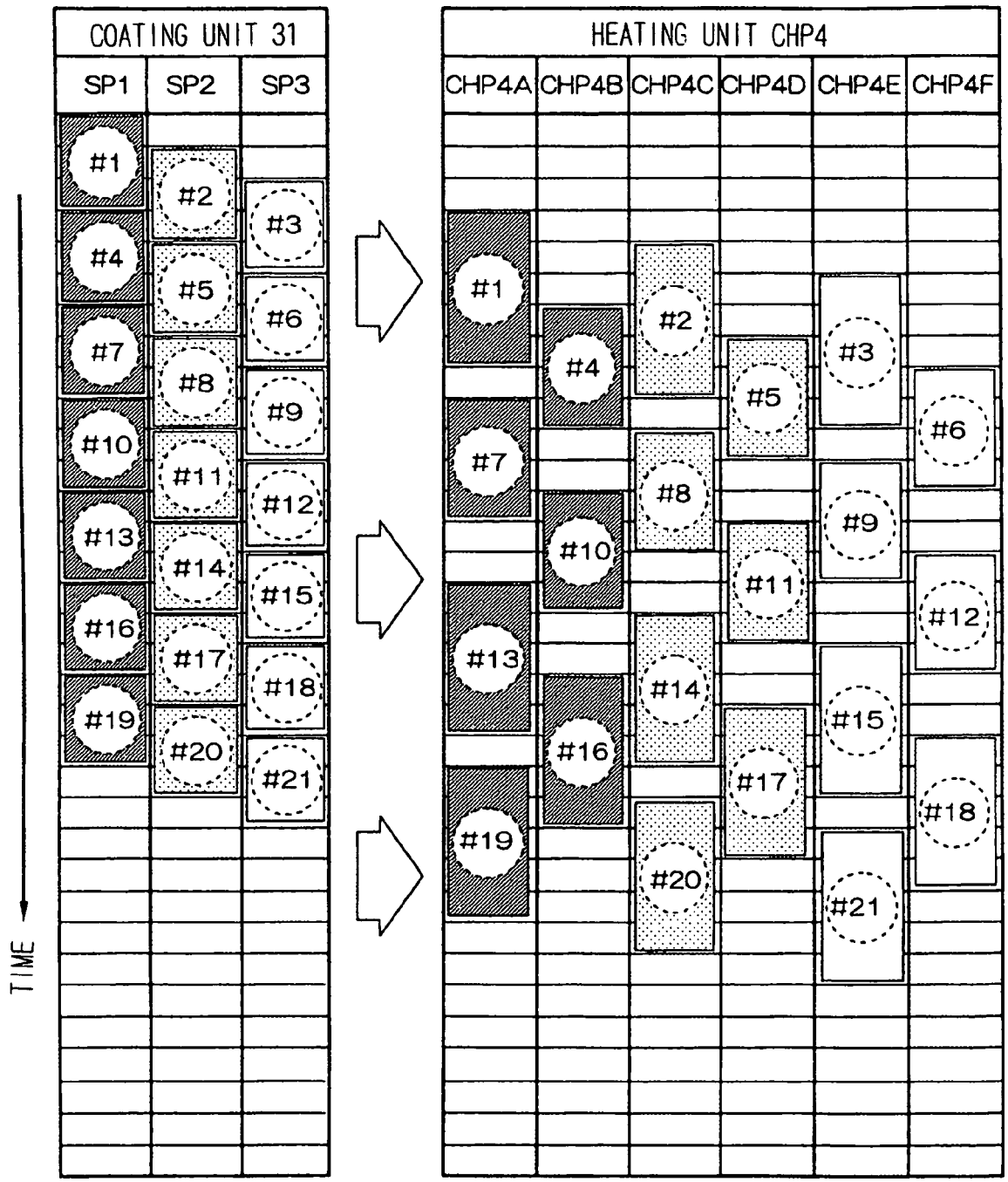
FIG. 9 is a diagram showing the correspondence of sending modules and receiving modules for a permanent assignment mode.
Figure 10:
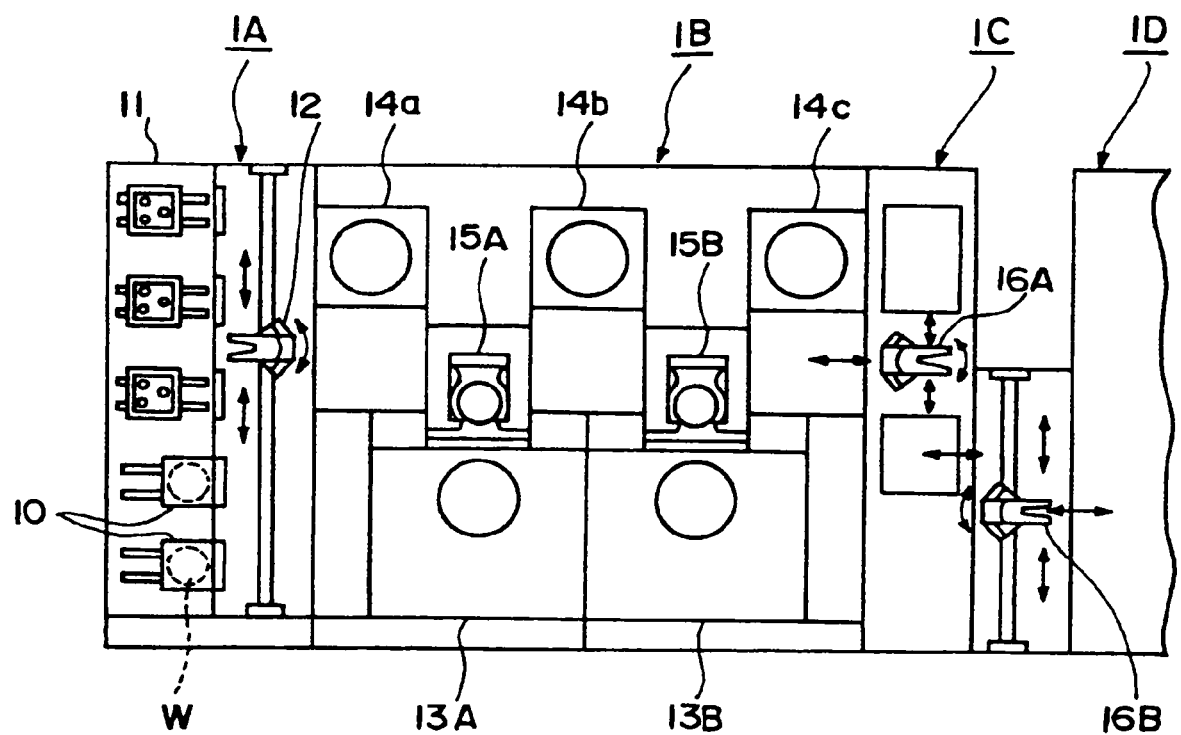
FIG. 10 is a plan view of a known resist pattern forming system.

Suppose that the coating unit 31 has three coating modules SP1 to SP3 and the heating unit CHP4 has six heating modules CHP4A to CHP4F as shown in FIGS. 8 and 9. The number of wafers W to be processed is twenty-one. In FIGS. 8 and 9, numbers attached to the wafers W indicate order in which the wafers W are carried to the coating unit 31.

Referring to FIG. 7, the control unit 6 reads carrying recipe information specifying the order of processes for processing each wafer W in step S1. The control unit reads module arrangement information in step S2. The module arrangement information specifies the respective positions of the modules. In this embodiment, the module arrangement information includes information about the arrangement of the coating modules SP1 to SP3 and the heating units CHP4A to CHP4F.

The control unit 6 makes the permanent assignment information 62 in step S3 on the basis of the information read in steps S1 and S2. As mentioned above the permanent assignment information 62 assigns the heating units (heating modules) CHP4A to CHP4F, namely, the receiving modules, permanently to the coating modules SP1 to SP3, namely, the sending modules.

In step S4, the control unit 6 executes the carrying schedule main program 61 on the basis of the carrying recipe read in step S1 to start carrying the wafers W in the flexible carrying mode, namely, the basic carrying mode. As shown in FIG. 8 by way of example, the wafers W are carried to the heating units CHP4 in the order of processing the wafers W by the modules SP1 to SP3 of the coating unit 31 in the flexible carrying mode; the wafers W are carried preferentially to the inoperative ones of the CHP4A to CHP4F along shorter carrying routes.

If a carrying mode change command is given to the control unit 6 in step S5 while the carrying schedule main program 61 is being executed, the program changes the flexible carrying mode for the permanent assignment mode to continue carrying the wafers W in the permanent assignment mode in step S6. When the permanent assignment mode is executed on the basis of the permanent assignment information 62, the wafer W processed by the module SP1 is carried to the heating unit CHP4A or CHP4B, the wafer W processed by the module SP2 is carried to the heating unit CHP4C or CHP4D and the wafer W processed by the module SP3 is carried to the heating unit CHP4E or CHP4F as shown in FIG. 9 by way of example.

If any carrying mode change command is not given to the control unit 6 in step S5 and all the wafers W have been carried to the heating modules CHP4A to CHP4F in step S7, the carrying mode selecting procedure is ended.

Giving the carrying mode change command to the control unit 6 in step S5 is triggered, for example, by the detection of a defect in the film formed on the wafer W by the coating process, such as a film of an abnormal thickness. The carrying mode change command is given to facilitate finding the coating module that formed the defective film. When the wafers W are carried in the flexible carrying mode, it is difficult to find out which one of the modules SP1 to SP3 formed the defective film. Since the permanent assignment mode fixes carrying routes for carrying the wafers W and hence the coating module that formed the defective film can be easily found out.

If it is decided in step S7 that all the wafers W have not yet been carried to the heating modules CHP4A to CHP4F, the permanent assignment mode can be replaced with the flexible carrying mode by giving another carrying mode change command to the control unit 6. The defective coating module found out by carrying the wafers W in the permanent assignment mode can be set in an inoperative state and the wafers W can be carried in the flexible carrying mode to continue processing the wafers W by using the other normal coating modules.

If the number of the wafers W to be processed is very large and the wafers W are carried in the flexible carrying mode, some wafers W may be carried along long carrying routes and throughput is likely to reduce. The wafers W can be carried along the fixed short carrying routes and the reduction of throughput can be restricted by changing the flexible carrying mode for the permanent assignment mode.

The resist pattern forming system 100 in this embodiment can carry wafers W selectively by the flexible carrying mode in which wafers are carried preferentially along the shorter carrying routes or the permanent assignment mode in which the receiving modules are permanently assigned to the sending modules. Thus a defective module can be easily found out by carrying the wafers in the permanent assignment mode and the permanent assignment mode is changed for the flexible carrying mode after finding the defective module to continue processing the wafers.

The reduction of throughput can be suppressed by changing the flexible carrying mode for the permanent assignment mode to carry the wafers along the short carrying routes when a large number of wafers are to be processed.

Although the resist pattern forming system 100 in this embodiment descried above uses the flexible carrying mode as the basic carrying mode, the permanent assignment mode may be used as the basic carrying mode.

Although the carrying schedule specifying carrying operations for carrying wafers between the coating unit 31 and the heating unit CHP4 by way of example, a substrate processing method of the present invention is applicable to a carrying schedule specifying carrying operations for carrying wafers between processing modules other than those of the coating unit 31 and the heating unit CHP4.

Although the foregoing embodiment has been described as applied to processing semiconductor wafers, substrates to be processed by the substrate processing system of the present invention is not limited to semiconductor wafers and may be LCD substrates, CD substrates, glass substrates, photomasks or printed wiring boards.

The present invention is applicable to resist pattern forming systems for processing substrates, such as semiconductor wafers and is suitably applicable to the semiconductor device manufacturing industry, the electronic device manufacturing industry and the like.

What is claimed is:

1. A substrate processing method to be carried out by a substrate processing system capable of processing a plurality of substrates in a single-substrate processing mode using a plurality of processes, the substrate processing system being provided with a plurality of modules respectively for carrying out successive processes, and the substrate processing system carrying out a plurality of processes successively, and the substrate processing system having a plurality of same modules for carrying out each process of the a plurality of processes, the substrate processing method comprising the steps of:

carrying a substrate in one of at least two carrying modes, each carrying mode specifying a method of assigning receiving modules to sending modules, the receiving modules being part of the a plurality of same modules for carrying out one process of the a plurality of processes, and the sending modules being a part of the a plurality of same modules for carrying our another process of the a plurality of processes, and each of the receiving modules corresponding to each of the sending modules respectively, the substrate being transferred by a transfer arm commonly used in each carrying mode of the at least two carrying modes;

changing from a carrying mode in effect of the at least two carrying modes, to an other carrying mode of the at least two carrying modes when a carrying mode change command is given while substrates are being processed; and carrying substrates in the other carrying mode which was newly brought into effect by the carrying mode change command.

2. The substrate processing method according to claim 1, wherein at least one of the carrying modes is a permanent assignment mode that permanently assigns one or a plurality of receiving modules to one or a plurality of sending modules under predetermined conditions.

3. The substrate processing method according to claim 2, wherein one of the predetermined conditions is selecting a receiving module based on a shorter carrying distances from sending modules.

4. The substrate processing method according to claim 2, wherein one of the carrying modes preferentially selects an inoperative module as a receiving module.

5. The substrate processing method according to claim 1, wherein one of the carrying modes preferentially selects an inoperative module as a receiving module.

* * * * *